US006365970B1

(12) United States Patent
Tsai et al.

(10) Patent No.: US 6,365,970 B1
(45) Date of Patent: Apr. 2, 2002

(54) BOND PAD STRUCTURE AND ITS METHOD OF FABRICATING

(75) Inventors: Chen-Wen Tsai; Chung-Ju Wu; Wei-Feng Lin, all of Hsinchu (TW)

(73) Assignee: Silicon Integrated Systems Corporation (TW)

( * ) Notice: Subject to any disclaimer, the term of this patent is extended or adjusted under 35 U.S.C. 154(b) by 0 days.

(21) Appl. No.: 09/458,778

(22) Filed: Dec. 10, 1999

(51) Int. Cl.$^7$ .............................................. H01L 23/48
(52) U.S. Cl. .................... 257/751; 257/763; 257/781; 257/786
(58) Field of Search ................................. 257/751, 752, 257/763, 773, 786, 781

(56) References Cited

U.S. PATENT DOCUMENTS

| | | | | |
|---|---|---|---|---|
| 5,202,579 A | * | 4/1993 | Fujii et al. .................... | 257/751 |
| 5,287,002 A | * | 2/1994 | Freeman, Jr. et al. ........ | 257/781 |
| 5,403,777 A | | 4/1995 | Bryant et al. | |
| 5,502,337 A | * | 3/1996 | Nozako ....................... | 257/773 |
| 5,739,587 A | * | 4/1998 | Sato ............................ | 257/758 |
| 5,923,088 A | | 7/1999 | Shiue et al. ................. | 257/758 |
| 5,942,800 A | | 8/1999 | Yiu et al. .................... | 257/754 |
| 6,207,547 B1 | * | 3/2001 | Chittipeddi et al. ......... | 4257/612 |

OTHER PUBLICATIONS

Wolf, S., Silicon Processing for the VLSI Era, vol. 2, Lattice Press, 1990, pp. 124–126, 191, 264.*

* cited by examiner

Primary Examiner—T. N. Quach
(74) Attorney, Agent, or Firm—Oppenheimer, Wolff & Donnelly, LLP

(57) ABSTRACT

A bond pad structure and a method of fabricating such structure are disclosed in the invention. The bond pad structure is formed over a predetermined area defined on a semiconductor substrate. The bond pad structure includes at least two metal layers formed over the predetermined area and at least one sub-structure combination layer which each is formed over the predetermined area and formed between two corresponding first metal layers. Each sub-structure combination layer includes a dielectric layer formed over the predetermined area, formed-through via openings with special disposition on the dielectric layer, a first diffusion barrier layer formed over the dielectric layer and the sidewalls and bottom of the via openings, a metal material filled into the via openings to form via plugs, and a second diffusion barrier layer formed over the first diffusion barrier layer and via plugs. Due to special disposition of via plugs and well adhesion between metal layer and diffusion barrier layers, the bond pad structure, according to the invention, can prevent form damage possibly induced during subsequent probe test procedure and wire bonding process.

18 Claims, 8 Drawing Sheets

BOND PAD STRUCTURE AND ITS METHOD OF FABRICATING

FIELD OF THE INVENTION

The present invention relates to a bond pad structure and a method of fabricating such structure, and more in particular, to a bond pad structure with well interface adhesion and a special disposition of via plugs to prevent from peeling of top metal pad (bonding metal layer) and fracture of top dielectric layer possibly induced during subsequent probe test procedure and wire bonding process.

BACKGROUND OF THE INVENTION

Bond pads provide an integrated circuit (IC) chip with location for bonding wires or other connectors. It is obvious that when the IC chip is fabricated, its yield is affected significantly by the reliability of bond pad on itself. Nevertheless, after being manufactured, a bond pad of an IC chip usually suffers from damages during subsequent probe test procedure and wire bonding process. The cause of possible damages of the bond pads induced during probe test procedure and wire bonding process will be explained as follows.

Referring to FIGS. 1A and 1B, a bond pad structure 1 of a prior art is disclosed. FIG. 1A is a top view of the bond pad structure 1. FIG. 1B is a section view showing the bond pad structure 1 of FIG. 1A along A—A line. In general, the bond pad structure 1 is formed over a predetermined area defined on a semiconductor substrate (not shown). In FIG. 1A, the circle patterns with dashed line represent via plugs 123 formed underneath a top metal layer 11 (bonding metal layer) of the bond pad structure 1. As shown in FIG. 1B, the bond pad structure 1 includes at least two metal layers 11 and at least one sub-structure combination layer 12 which each is formed between two corresponding metal layers 11. It is noted that the number of the metal layers of the bond pad structure depends on the practical semiconductor manufacture. For instance, a bond pad with five metal layers is usually employed in an IC chip fabricated in 0.25 µm semiconductor technology. Herein, the bond pad structure 1 with five metal layers 11 and four sub-structure combination layers 12 is also taken as an example, as shown in FIG. 1B. In general, the lowest metal layer 11 of the bond pad structure 1 is formed on an insulating layer (not shown) which is previously formed on the semiconductor substrate.

As shown in FIG. 1B, each sub-structure combination layer 12 includes a dielectric layer 121 formed over the predetermined area. The dielectric layer 121 has via openings formed through itself. Each sub-structure combination layer 12 also includes a diffusion barrier layer 122 formed over the dielectric layer 121 and the sidewalls and bottom of the via openings, and a metal material filled into the via openings to form via plugs 123. It is noted that the via plugs 123 in the bond pad structure 1 of the prior art are distributed uniformly on the predetermined area.

After being manufactured, bond pads of an IC chip must be executed a CP test that is performed by piercing a probe into the top metal layer of the bond pads and then by conducting current signal into the bond pads. Referring to FIG. 2A, a top view of the bond pad structure 1 of FIG. 1A, being executed CP test via a probe 21, is illustratively shown. Due to narrow space and inherent brittlement, part of the dielectric layers between via plugs have weak resistance to external compressive force. Therefore, during the probe test of the bond pad 1, the fracture induced by compressive force of the probe 21 possibly occurs in the dielectric layers 121. Subsequently, cracks 22 initiating from the fractured dielectric layer 121 propagate. Referring to FIG. 2B, a section view of the bond pad structure 1 in FIG. 2A is shown along B—B line. As shown in FIG. 2B, the dielectric layers 121 in the bond pad structure 1 have no sufficient resistance to the propagation of the cracks 22. Thus, further damages, such as delamination or even peeling of the top metal layer 11 (boding metal layer) of the bond pad structure 1, will occur.

Besides, when a wire bonding process is performed on a bond pad, the process normally entails the bonding of a gold or aluminum wire to the bond pad by fusing the bond pad and wire together via a compressive force and an ultrasonic energy. Referring to FIG. 3A, a section view of the bond pad structure 1 of FIG. 1A, which is bonded with a wire 31, is illustratively shown along A—A line. Unfortunately, the compressive force and ultrasonic energy always introduces high level of shear stress $\tau$ into the bond pad structure 1 to attack weak interfaces thereof, such as metal layer 11/diffusion barrier layer 122 interface. It is expected that the bond pad structure 1 with damaged interfaces will suffer from further damages resulting from tensile stress and shear stress, such as delamination 32 and peeling of the top metal layer 11 (bonding metal layer), as shown in FIG. 3B.

Obviously, the aforesaid damages decay the reliability of the bond pads and even the performance of the IC chip with the damaged bond pads. Several researches regarding the stress buffer and interface adhesion of bond pad structure have been disclosed and are listed as follows: the U.S. Pat. Nos. 5,266,522; 5,403,777; 5,923,088; and 5,942,800.

However, the foregoing and other state-of-the-art bond pad structures still indicate the need for a new bond pad structure with well adhesion and high reliability. It is also desirable that the bond pad structure thereof is capable of resisting the propagation of cracks initiating in fractured dielectric layers during a probe test, and that the bond pad structure thereof is capable of buffering shear stress induced during a wire bonding process. The present invention is directed toward satisfying the aforesaid need.

SUMMARY OF THE INVENTION

It is an objective of the invention to provide a bond pad structure and a method of fabricating such structure whereby the bond pad structure has high reliability and well adhesion between an upper metal layer and an underneath diffusion barrier layer.

It is another objective of the invention to provide a bond pad structure and a method of fabricating such structure whereby the bond pad structure is capable of resisting crack propagation in fractured dielectric layers during a probe test to further prevent from delamination and peeling of a top metal layer of the bond pad structure.

It is another objective of the invention to provide a bond pad structure and a method of fabricating such structure whereby the bond pad structure thereof is capable of buffering stress induced during a wire bonding process to prevent from delamination and peeling of a top metal layer of the bond pad structure.

According to the invention, a bond pad structure is formed over a predetermined area A defined on a semiconductor substrate. The predetermined area A is divided into a first area B surrounding the periphery of the predetermined area A, a second area C spread at a central part of the predetermined area A, at least one pair of third areas D adjacent to the first area B, and a fourth area E between the second and third area as well as between the second and first area (B, C and D). The bond pad structure includes at least two metal layers formed over the predetermined area A and at least one structure combination which each is formed over the predetermined area A and formed between two corresponding metal layers. Each structure combination includes a dielectric layer formed over the predetermined area. The dielectric layer has via openings formed over the dielectric layer and the sidewalls and bottom via openings, a metal material filled into the via openings to form via plugs, and a second diffusion barrier layer formed over the first diffusion barrier layer via plugs formed over the first diffusion barrier layer and via plugs.

According to the invention, a method of fabricating a bond pad structure is provided. The bond pad is formed over a predetermined area A defined on a semiconductor substrate. The predetermined area A is divided into a first area B surrounding the periphery of the predetermined area A, a second area C spread at a central part of the predetermined area A, at least one pair of third areas D adjacent to the first area B, and a fourth area E between the second and third area as well as between the second and first area (B, C and D). The method is first to form a lower metal layer over the predetermined area A. Afterward, the method is to form a dielectric layer over the lower metal layer. The method is then to etch partially the dielectric layer to form via openings through the dielectric layer on the first, second and third areas (B, C and D), respectively. Afterward, the method is to form a first diffusion barrier layer over the dielectric layer and the sidewalls and bottom of the via openings. The method is then to deposit a metal material overlaying the resultant structure such that the via openings are filled with the metal material to form via plugs. Afterward, the method is to perform a planarization process to expose part of the first diffusion layer and the metal material filled within the via plugs. Afterward, the method is to form a second diffusion barrier layer over the first diffusion barrier layer and via plugs. The method is then to form an upper metal layer over the second diffusion barrier layer. The method further includes a step of reiterating N times the step of forming the dielectric layer over the metal layer through the step of forming the upper metal layer over the second diffusion barrier layer. N is equal to the result that the number of the metal layers of the bond pad structure is subtracted by two.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1A:
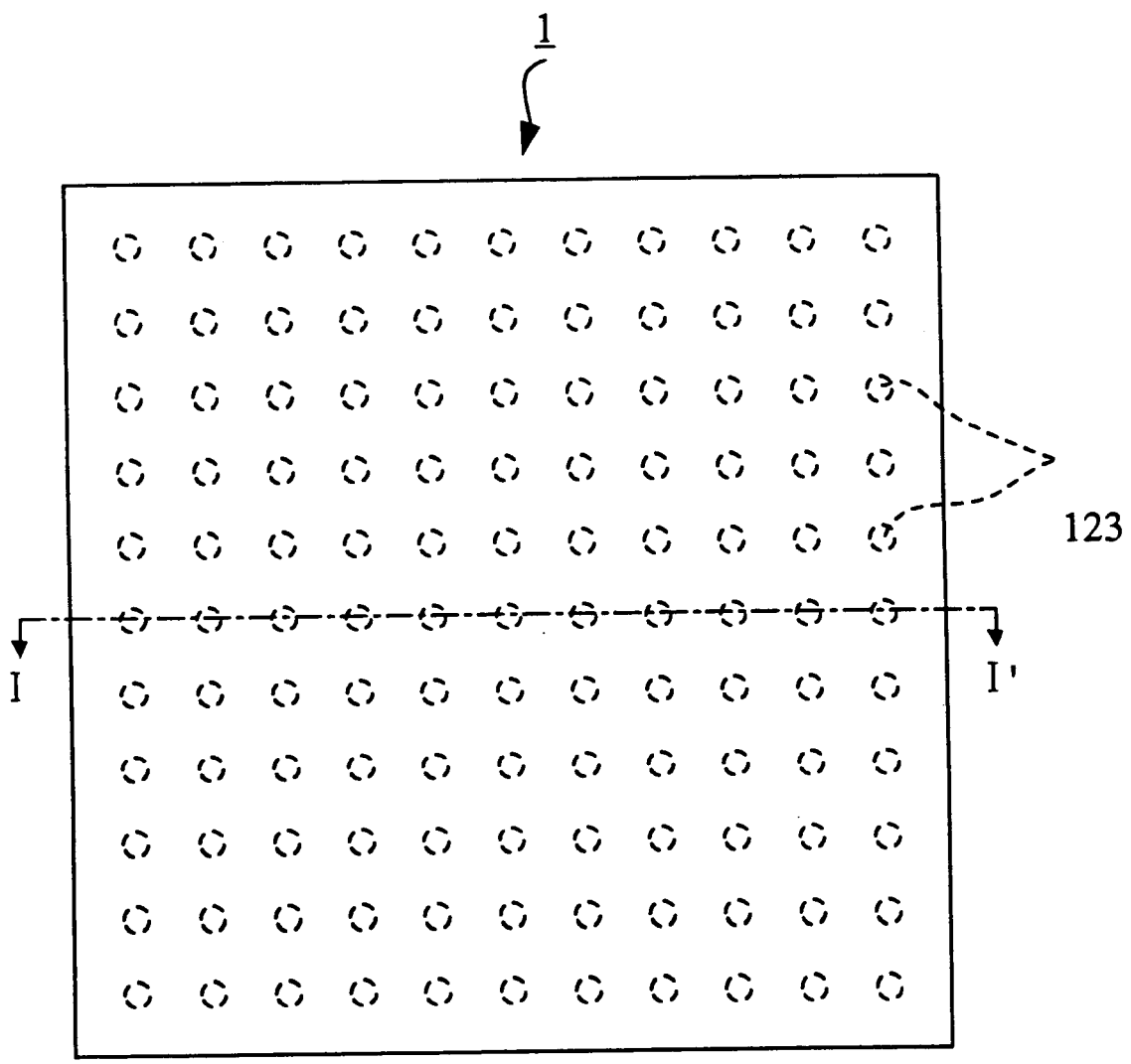
FIG. 1A is a top view of a bond pad structure 1 of a prior art.
Figure 1B:
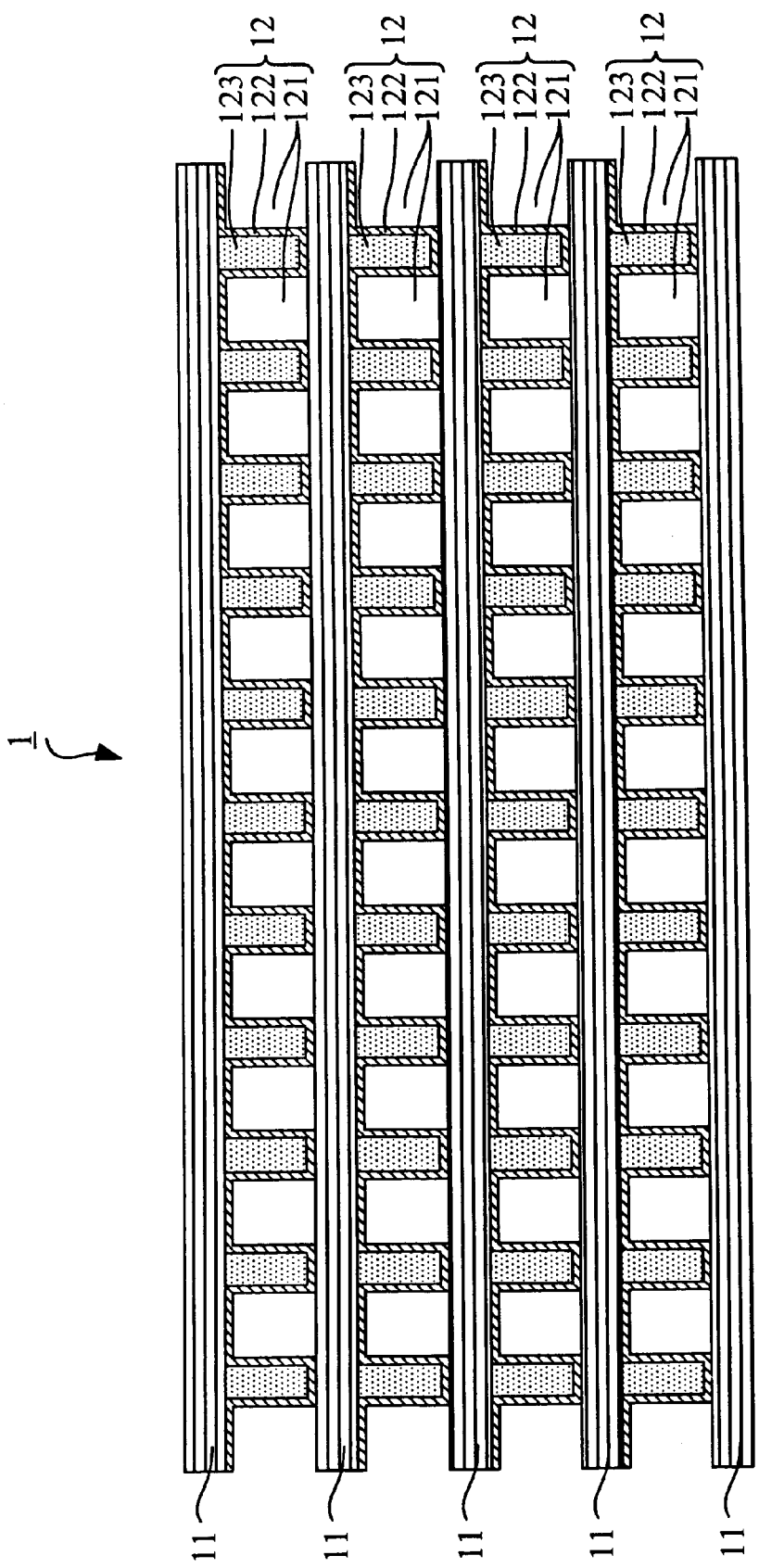
FIG. 1B is a section view of the bond pad structure 1 of FIG. 1A along A—A line.
Figure 2A:
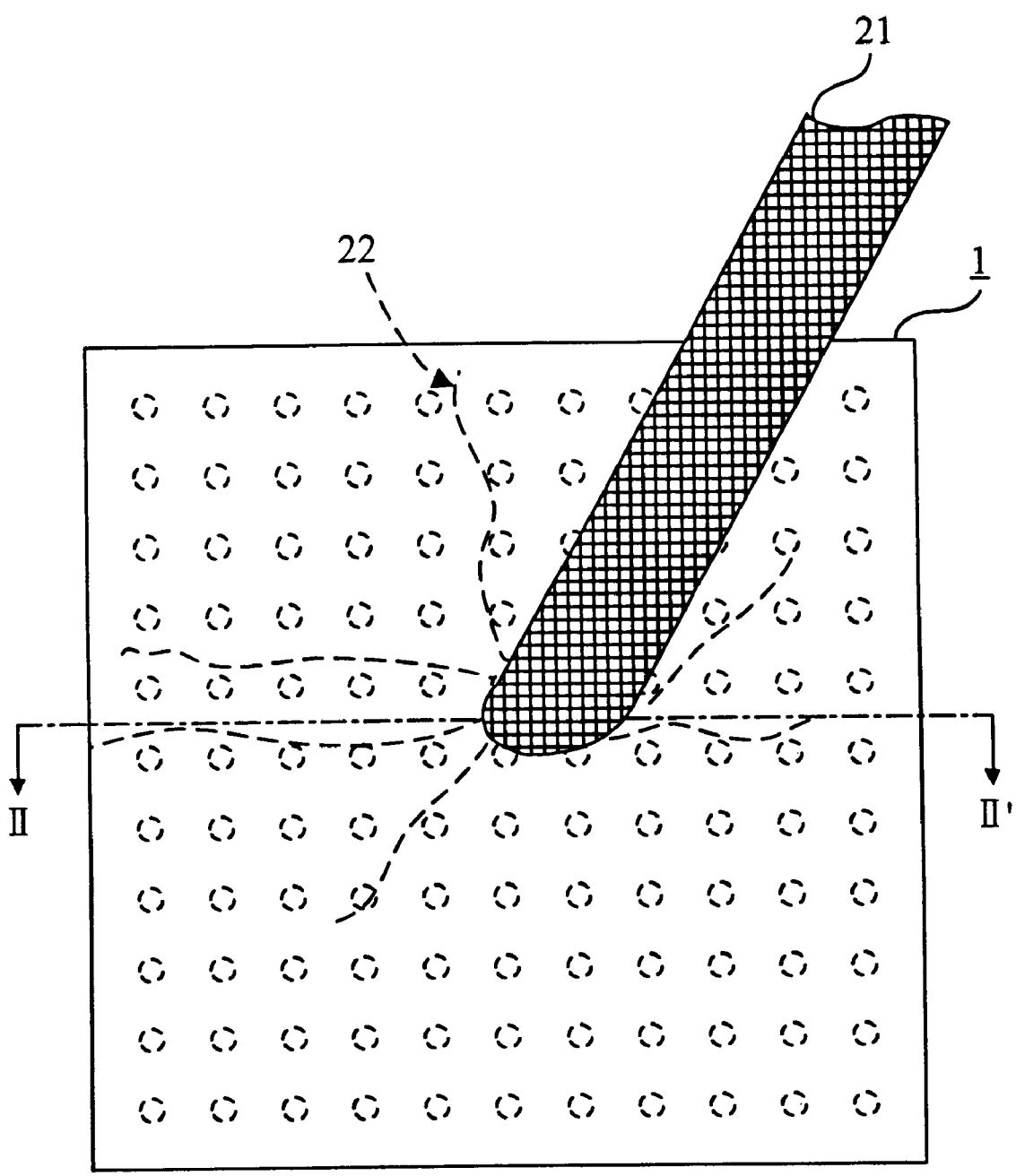
FIG. 2A is a diagram illustrating possible damages of the bond pad structure 1 of FIG. 1A during a probe test procedure.
Figure 2B:
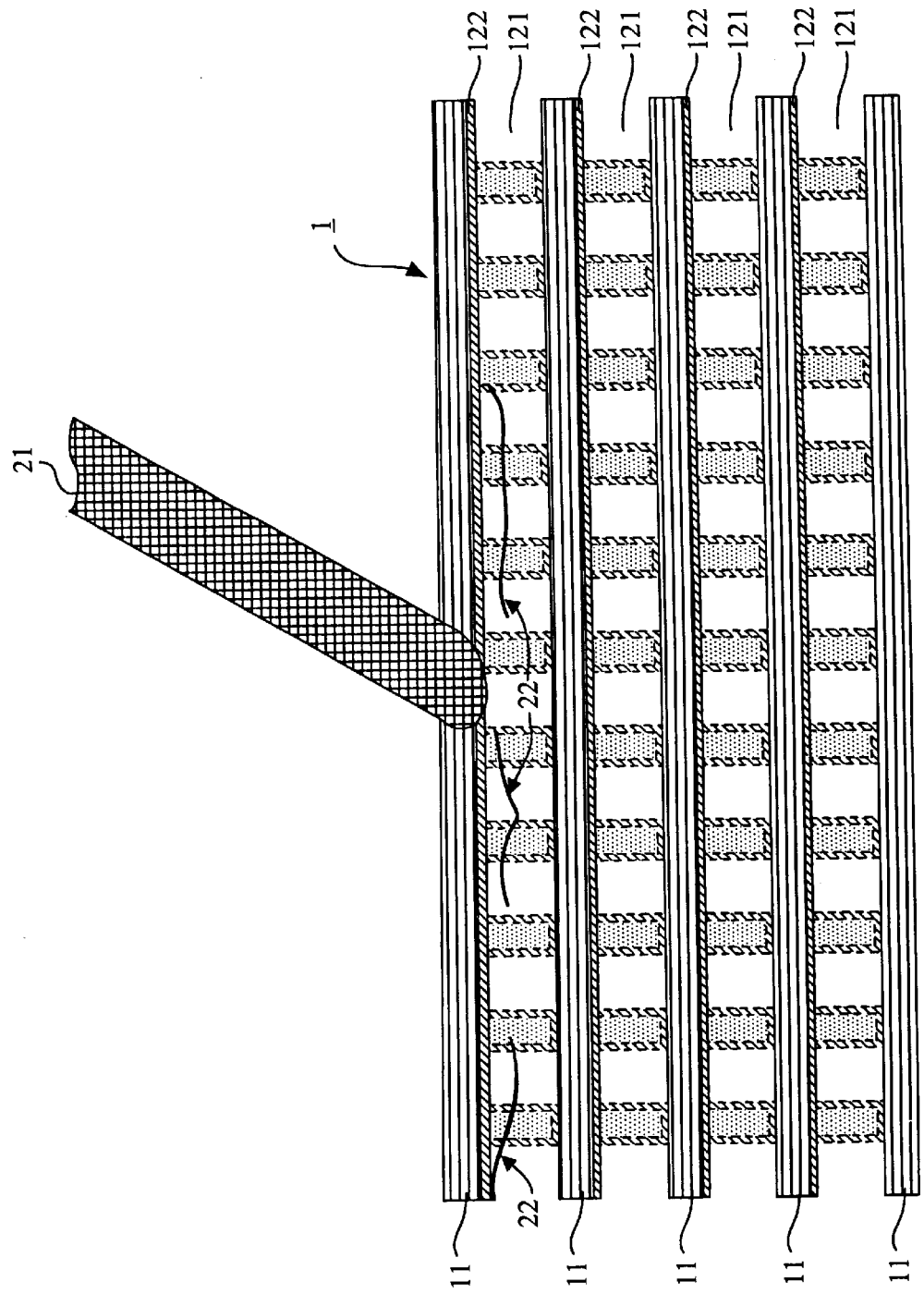
FIG. 2B is a section view of the bond pad structure 1 shown in FIG. 2A along B—B line.
Figure 3A:
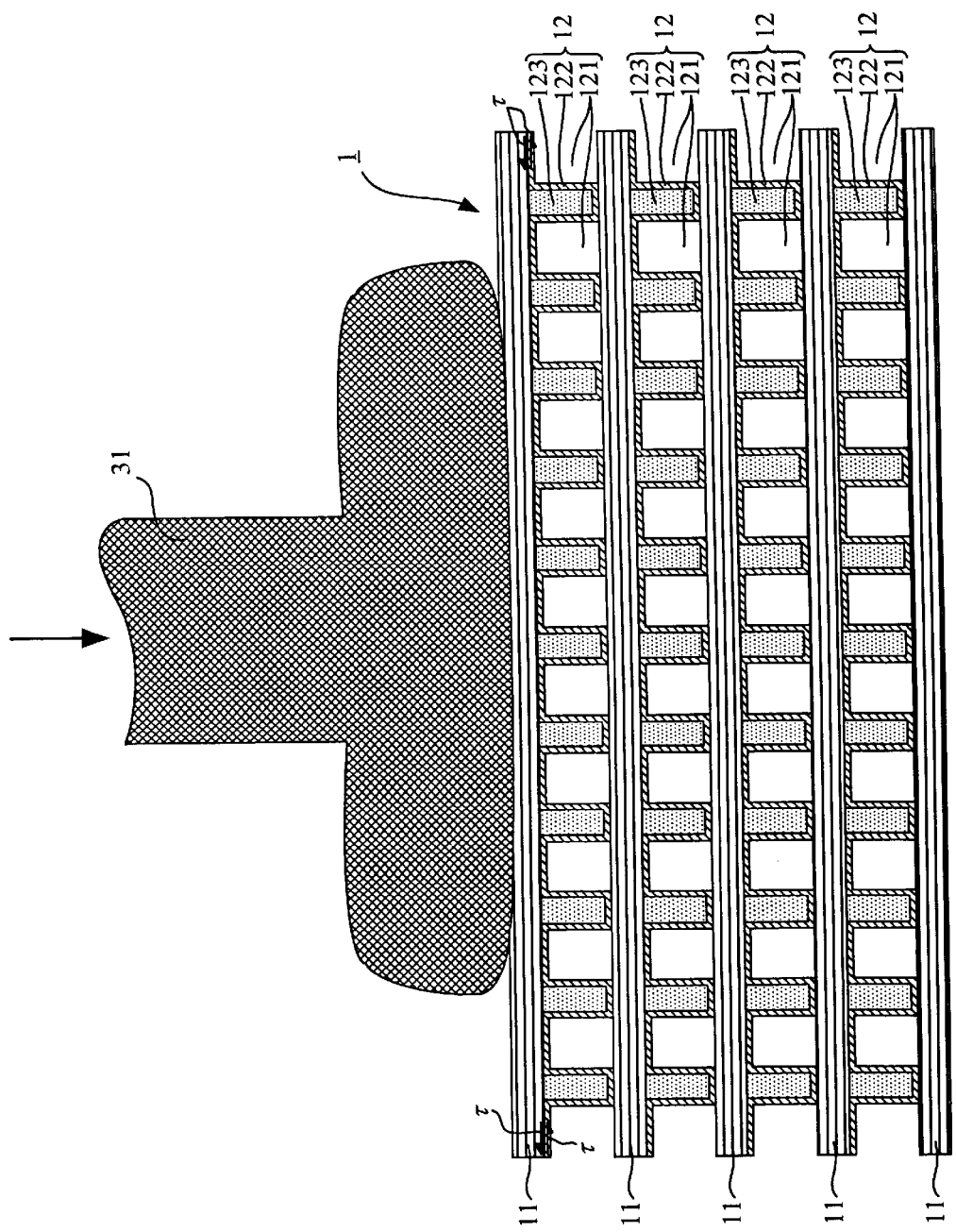
FIG. 3A and FIG. 3B are section views illustrating possible damages of the bond pad structure 1 of FIG. 1A during a wire binding process along A—A line.
Figure 3B:
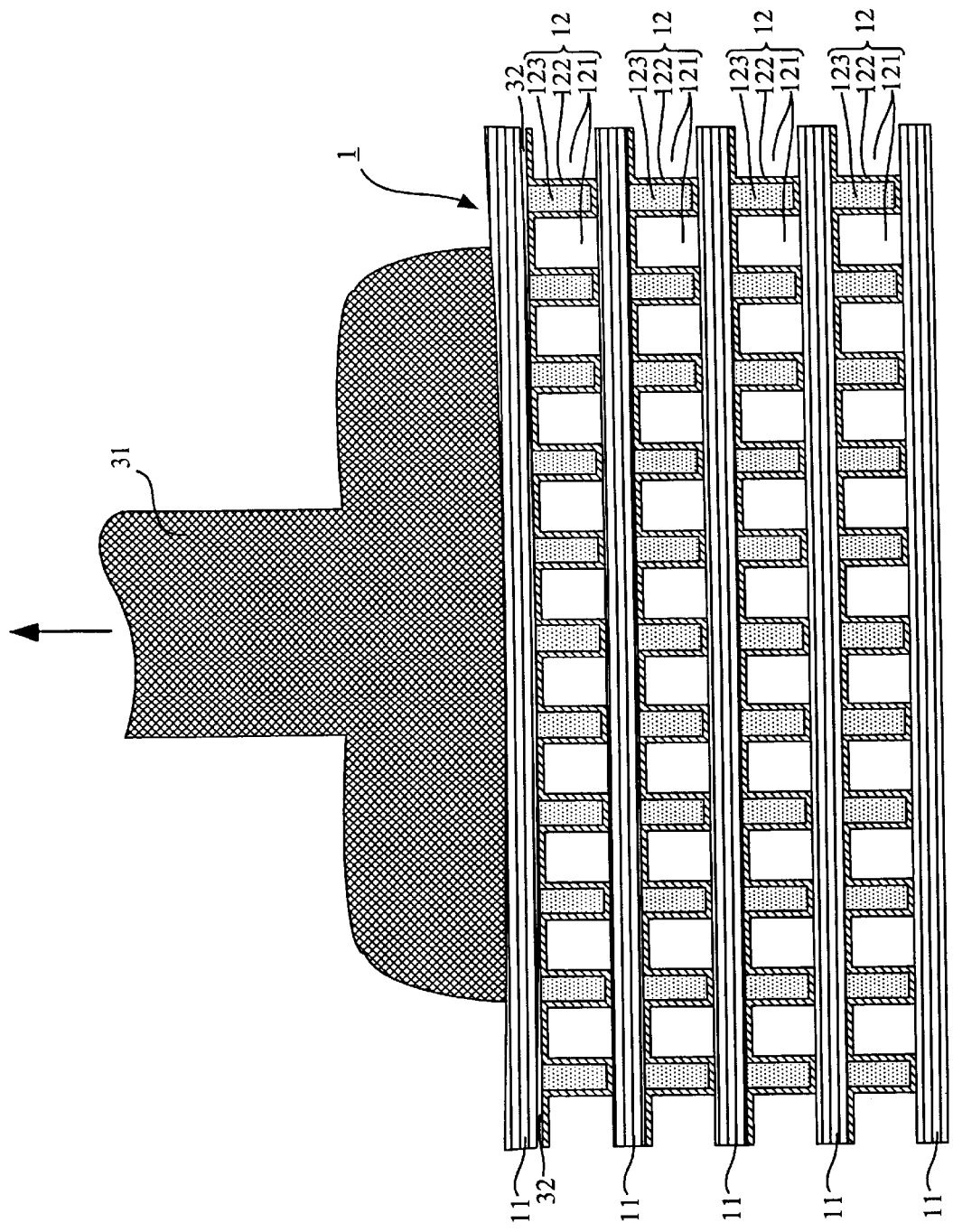
Figure 4A:
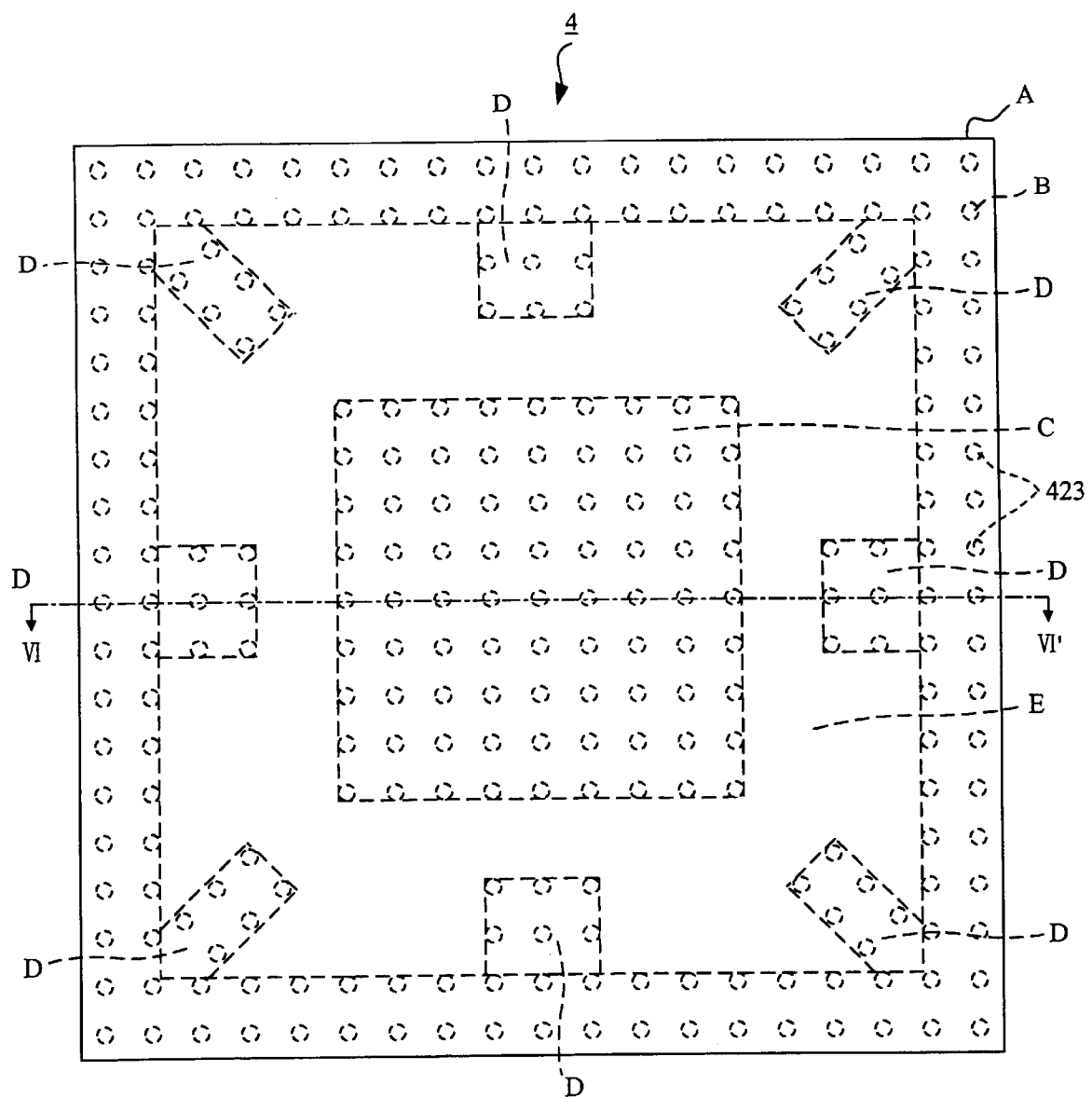
FIG. 4A is a top view of a bond pad structure 4 according to a preferred embodiment of the invention.
Figure 4B:
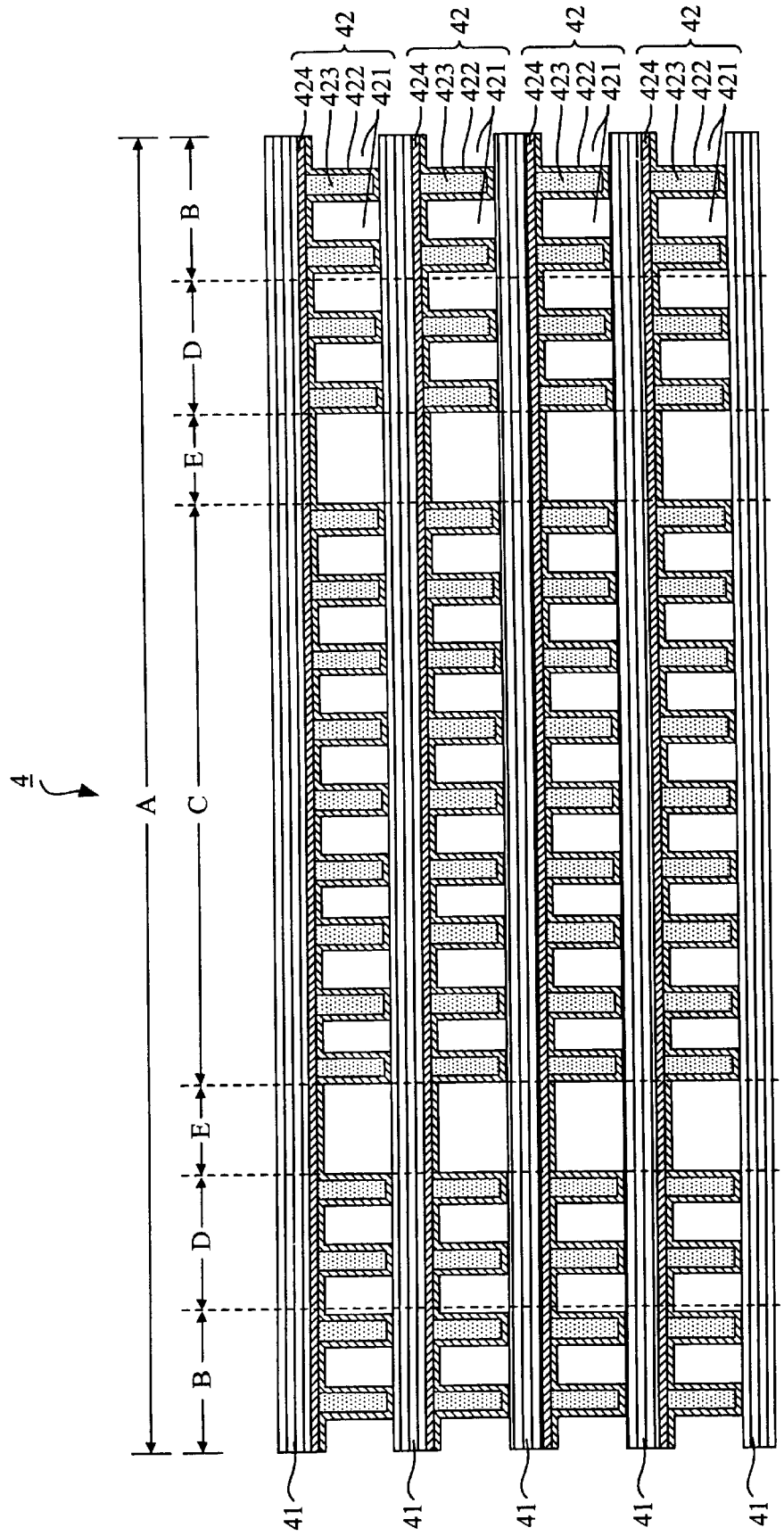
FIG. 4B is a section view showing the bond pad structure 4 of FIG. 4A along F—F line.

Referring to FIG. 4A and FIG. 4B, a bond pad structure 4 according to a preferred embodiment of the invention is disclosed. FIG. 4A is a top view of the bond pad structure 4. FIG. 4B is a section view showing the bond pad structure 4 of FIG. 4A along F—F line. According to the invention, the bond pad structure 4 is formed over a predetermined area defined on the semiconductor substrate (not shown). The predetermined area is divided into a first area surrounding the periphery of the predetermined area, a second area spread at the central part of the predetermined area, at least one pair of third areas adjacent to the first area, and a fourth area between the between the second and third area as well as between the second and first area. As shown in FIG. 4A, reference mark A denotes the predetermined area, reference mark B denotes the first area, reference mark C denotes the second area, reference mark D denotes the third areas, and reference mark E denotes the fourth area. In particular, each pair of third areas are located symmetrically from each other to prevent from non-uniform distribution of stress induced during a wire bonding process. In FIG. 4A, the circle patterns with dashed line represent via plugs 423 formed underneath top metal layer 41 of the bond pad structure 4, i.e., the via plugs 423 are formed underneath the top first metal layer 41 of the bond pad structure 4 on the first area B, second area C and third areas D.

In an embodiment, just like customary bond pads, the predetermined area A, which the bond pad structure 4 is to be formed over, is a square area, as shown in FIG. 4A. The square shape shown by the top view of the bond pad can give convenient for a position step in a subsequent wire bonding process.

In an embodiment, the first area B is a frame-shaped area surrounding the periphery of the predetermined area A, as shown in FIG. 4A.

In an embodiment, the second area C is a square area, as shown in FIG. 4A. In another embodiment, the second area is a circle area or other shaped area which is easily patterned in semiconductor manufacture.

As shown in FIG. 4B, the bond pad structure 4 includes at least two metal layers 41 formed over the predetermined area A and at least one sub-structure combination layer 42 which each is formed over the predetermined area A and formed between two corresponding metal layers 41. It is noted that the number of the metal layers of the bond pad structure according to the invention depends on the practical semiconductor manufacture. For instance, a bond pad with five metal layers is usually employed in an IC chip fabricated in 0.25 $\mu$m semiconductor technology. Herein, the bond pad structure with five metal layers 41 and four sub-structure combination layers 42 is also taken as an example, as shown in FIG. 4B. In practical application, the lowest metal layer 41 of the bond pad structure 4 according to the invention is usually formed on an insulating layer (not shown) which is previously formed on the semiconductor substrate.

According to the invention, each sub-structure combination layer 42 includes a dielectric layer 421 formed over the predetermined area A. The dielectric layer 421 has via openings formed through itself on the first, second and third areas (B, C and D), respectively. Each sub-structure combination layer 42 also includes a first diffusion barrier layer 422 formed over the dielectric layer 421 and the sidewalls and bottom of the via openings, a metal material filled into the via openings to form via plugs 423, and a second diffusion barrier layer 424 formed over the first diffusion barrier layer 422 and via plugs 423.

In an embodiment, the metal layers 41 are formed of a material selected from the group consisting of Al, AlCu and AlCuSi.

In an embodiment, the first and second diffusion barrier layers (422 and 424) are formed of a material selected from the group consisting of TiN and TiW.

In an embodiment, the metal material is a tungsten material.

Hereinafter, advantages of the bond pad structure according to the invention will be specified.

According to the invention, portions of the bond pad structure 4 with via plugs 423 are mainly formed of ductile materials. Obviously, the portions of the bond pad structure 4 with via plugs 423 would deform when suffer from external force. During a wire bonding process, the deformed portions of the bond pad structure 4 on the second area C can release induced stress and conduct the compressive force in the wire bonding process downward to promote the wire bonding. In addition, the deformed portions of the bond pad structure 4 on the first area B and third areas D can resist the edge of the bond pad structure 4 to bend upward. Therefore, the bond pad structure 4 according to the invention is capable of buffering stress induced during subsequent probe test procedure and wire bonding process to prevent from delamination and peeling of the top first metal layer 41.

Due to narrow space and inherent brittlement, part of the dielectric layers 421 between via plugs 423 have weak resistance to external compressive force. When a CP test is performed, via a probe, to a bond pad structure 4 according to the invention, the fracture induced by piercing of the probe possibly occurs in the part of the dielectric layer 421 beneath the top metal layer 41 between the via plugs 423 on the second area C. According to the invention, the via plugs 423 are not formed on portions of the bond pad structure 4 on the fourth area E. During the CP test, part of the dielectric layer 421 beneath the top metal layer 41 on the fourth area E provide sufficient space for the propagation of the cracks from the fractured dielectric layer 421 on the second area C to stop the cracks. The cracks from part of the fractured dielectric layer 421 on the second area C is finally blocked in the part of the dielectric layer 421 on the fourth area E. Thereby, further damages, such as delamination and peeling of the top metal layer 41, can be prevented.

Differing from customary, bond pad structures, in the invention, the second diffusion barrier layer 424 is formed between the metal layer 41 and the first diffusion barrier layer 422. This causes that the metal layer 41/second diffusion layer interface 424 and the second diffusion barrier layer 424/first diffusion layer 422 interface both have well adhesion. Therefore, in the invention, weak interfaces in customary bond pad structures are eliminated. Furthermore, in the bond pad structure 4 of the invention, the- interfaces with well adhesion can resist to the attack of high level of shear stress.

In addition, the fabrication of the bond pad structure of the invention is a convenient process. This cannot increase complexity of whole fabrication of the IC chip. The fabrication of the bond pad structure according to the invention will be described in details as follows.

A method of fabricating the bond pad structure according to the invention is first to form a lower metal layer over the predetermined area A. Afterward, the method is to form a dielectric layer over the lower metal layer. The method is then to etch partially the dielectric layer to form via openings through the dielectric layer on the first, second and third areas (B, C and D), respectively. Afterward, the method is to form a first diffusion barrier layer over the dielectric layer and the sidewalls and bottom of the via openings. The method is then to depositing a metal material overlaying the resultant structure such that the via openings are filled with the metal material to form via plugs. Afterward, the method is to perform a planarization process to expose part of the first diffusion layer and the metal material filled within the via plugs. Afterward, the method is to form a second diffusion barrier layer over the first diffusion barrier layer and via plugs. The method is then to form an upper metal layer over the second diffusion barrier layer. When the number of the metal layers in the bond pad structure is more than two, the method further includes a step of reiterating N times the step of forming the dielectric layer over the lower metal layer through the step of forming the upper metal layer over the second diffusion barrier layer. N is equal to the result that the number of the metal layers of the bond pad structure is subtracted by two. For example, if the number of the metal layers of the bond pad structure is equal to five, N is equal to three.

While the invention has been described in some preferred embodiments, it is understood that the words which have been used are words of description rather than words of limitation and that changes within the purview of the appended claims may be made without departing from the scope and spirit of the inventions its broader aspect.

What is claimed is:

1. A bond pad structure formed over a predetermined area defined on a semiconductor substrate, the predetermined area being divided into a first area surrounding the periphery of the predetermined area, a second area spread at a central part of the predetermined area, at least one pair of third areas adjacent to the first area, and a fourth area between the second and third area as well as between the second and first area, said bond pad structure comprising:

a lower metal layer formed over the predetermined area;

a dielectric layer formed on the lower metal layer, the dielectric layer having via openings formed through the dielectric layer on the first, second and third areas only, respectively;

a first diffusion barrier layer formed over the dielectric layer and the sidewalls and bottom of the via openings;

via plugs formed by filling a metal material into the via openings;

a second diffusion barrier layer formed over the first diffusion barrier layer and via plugs; and an upper metal layer formed over the second diffusion barrier layer.

2. The bond pad structure of claim 1, wherein the predetermined area is a square area.

3. The bond pad structure of claim 1, wherein the second area is a square area.

4. The bond pad structure of claim 1, wherein the second area is a circle area.

5. The bond pad structure of claim 1, wherein each pair of third areas are located symmetrically from each other.

6. The bond pad structure of claim 1, wherein the lower and upper metal layers are formed of a material selected from the group consisting of Al, AlCu and AlCuSi.

7. The bond pad structure of claim 1, wherein the first and second diffusion barrier layers are formed of a material selected from the group consisting of TiN and TiW.

8. The bond pad structure of claim 1, wherein the metal material is a tungsten material.

9. The bond pad structure of claim 1, wherein the lower metal layer is formed on an insulating layer formed on the semiconductor substrate.

10. A bond pad structure formed over a predetermined area defined on a semiconductor substrate, the predetermined area being divided into a first area surrounding the periphery of the predetermined area, a second area spread at a central part of the predetermined area, at least one pair of third areas adjacent to the first area, and a fourth area between the second and third area as well as between the second and first area, said bond pad structure comprising:

- at least two metal layers formed over the predetermined area;
- at least one sub-structure combination layer, each sub-structure combination layer being formed between two corresponding metal layers and formed over the predetermined area, each sub-structure combination layer comprising:
- a dielectric layer formed over the predetermined area, the dielectric layer having via openings formed through the dielectric layer on the first, second and third areas only, respectively;
- a first diffusion barrier layer formed over the dielectric layer and the sidewalls and bottom of the via openings;
- via plugs formed by filling a metal material into the via openings; and
- a second diffusion barrier layer formed over the first diffusion barrier layer and via plugs.

11. The bond pad structure of claim 10, wherein the lowest one of the metal layers is formed on an insulating layer formed on the semiconductor substrate.

12. The bond pad structure of claim 10, wherein the predetermined area is a square area.

13. The bond pad structure of claim 10, wherein the second area is a square area.

14. The bond pad structure of claim 10, wherein the second area is a circle area.

15. The bond pad structure of claim 10, wherein each pair of third areas are located symmetrically from each other.

16. The bond pad structure of claim 10, wherein the metal layers are formed of a material selected from the group consisting of Al, AlCu and AlCuSi.

17. The bond pad structure of claim 10, wherein the first and second diffusion barrier layers are formed of a material selected from the group consisting of TiN and TiW.

18. The bond pad structure of claim 10, wherein the metal material is a tungsten material.

\* \* \* \* \*